US007994038B2

(12) United States Patent
Ramani et al.

(10) Patent No.: US 7,994,038 B2
(45) Date of Patent: Aug. 9, 2011

(54) METHOD TO REDUCE MOL DAMAGE ON NISI

(75) Inventors: Karthik Ramani, Hopewell Junction, NY (US); Paul R. Besser, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 194 days.

(21) Appl. No.: 12/366,378

(22) Filed: Feb. 5, 2009

(65) Prior Publication Data

US 2010/0193876 A1 Aug. 5, 2010

(51) Int. Cl.
*H01L 21/3205* (2006.01)

(52) U.S. Cl. .. 438/592; 438/651; 438/682; 257/E21.636

(58) Field of Classification Search .................. 438/197, 438/199, 275, 592, 651, 655, 664, 682; 257/E21.203, E21.296, E21.438, E21.622, 257/E21.636
See application file for complete search history.

(56) References Cited

U.S. PATENT DOCUMENTS 6,841,449 B1 1/2005 Bertrand et al.
2005/0247926 A1* 11/2005 Sun et al. ......................... 257/19
2006/0051961 A1* 3/2006 Cabral et al. ................... 438/664
2006/0284263 A1* 12/2006 Chang et al. .................. 257/383
2007/0093047 A1* 4/2007 Okuno et al. ................... 438/592
2009/0127594 A1* 5/2009 Arunachalam et al. ....... 257/288

* cited by examiner

*Primary Examiner* — Matthew C Landau
*Assistant Examiner* — Joseph C Nicely
(74) *Attorney, Agent, or Firm* — Ditthavong Mori & Steiner, P.C.

(57) ABSTRACT

Transistor devices are formed with nickel silicide layers formulated to prevent degradation upon removal of overlying stress liners. Embodiments include transistors with nickel silicide layers having a platinum composition gradient increasing in platinum content toward the upper surfaces thereof, i.e., increasing in platinum in a direction away from the gate electrode and source/drain regions. Embodiments include forming a first layer of nickel having a first amount of platinum and forming, on the first layer of nickel, a second layer of nickel having a second amount of platinum, the second weight percent of platinum being greater than the first weight percent. The layers of nickel are then annealed to form a nickel silicide layer having the platinum composition gradient increasing in platinum toward the upper surface. The platinum concentration gradient protects the nickel silicide layer during subsequent processing, as during etching to remove overlying stress liners, thereby avoiding a decrease in device performance.

14 Claims, 13 Drawing Sheets

METHOD TO REDUCE MOL DAMAGE ON NISI

TECHNICAL FIELD

The present disclosure relates to semiconductor devices with improved nickel silicide layers. The present disclosure is particularly applicable in fabricating transistors with improved device performance by avoiding nickel silicide degradation.

BACKGROUND

Conventional semiconductor devices, such as the one shown in FIG. 1, include a refractory metal deposited over all exposed upper surface features of a silicon substrate 101, preferably by means of physical vapor deposition (PVD). The most common refractory metal employed is nickel, which forms a very low resistivity silicide with silicon and does not consume as much Si as other silicides commonly employed. NiSi has a great resistance to etchants which are used to etch silicon oxide, a common insulating material used in semiconductor devices.

The refractory metal can be sputtered by DC magnetron sputtering in an ultra-high vacuum, multi-chamber system. Tile formation of an MOS transistor requires the formation of a gate structure 103 and source/drain junctions 105. The gate electrode 103 typically is formed by depositing a layer of heavily doped polysilicon 103a on a metal oxide insulating layer 103b and etching the layers to pattern the electrode. Sidewall spacers 107 are deposited on the opposing surfaces of the patterned gate electrode with oxide liner 109 between spacer 107 and both gate electrode 103 and substrate 101. The sidewall spacers 107 comprise silicon oxide, silicon nitride or silicon oxynitride.

Generally, in forming the MOS transistor, the refractory metal is deposited after etching the gate electrode 103 and after forming the source/drain junction 105, as illustrated in FIG. 1. After deposition, the refractory metal layer blankets the top surface of the gate electrode 103, sidewall spacers 107, oxide liners 109, and source/drain regions 105. As a result of thermal processing, e.g., a rapid thermal annealing (RTA) process, performed in an inert or reducing atmosphere, the refractory metal reacts with underlying silicon to form electrically conductive silicide layer portions 111 on the top surface of the polysilicon gate electrode 103 and on the exposed surfaces of the substrate where source and drain regions 105 are formed. Unreacted portions of the refractory metal layer, e.g., on the silicon oxide, nitride or oxynitride sidewall spacers 107 and the silicon oxide liner 109 are then removed, as by a wet etching process selective to the metal silicide portions 111.

Substrates based on "strained silicon" have attracted interest as a semiconductor material which provides increased speeds of electron and hole flow therethrough, thereby permitting fabrication of semiconductor devices with higher operating speeds, enhanced performance characteristics, and lower power consumption. A layer 101a of silicon-germanium (Si—Ge) is formed on a suitable crystalline substrate, e.g., a Si wafer or a silicon-on-insulator (SOI) wafer 101b. The Si—Ge layer has a greater lattice constant (spacing of Si and Ge atoms therein) relative to the underlying Si. As a consequence, the Si—Ge layer has a compressive strain. Electrons in such compressively strained layers have greater mobility than in conventional Si layers with smaller interatom spacings, i.e., there is less resistance to electron flow. For example, electron flow may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size. Conventional practices based on strained silicon technology also involve epitaxially growing a relaxed silicon layer on a tensilely stressed silicon layer which is subsequently doped to form relaxed source/drain regions in the relaxed silicon layer.

Conventional semiconductor devices typically comprise a plurality of active devices in or on a common semiconductor substrate, e.g., CMOS devices comprising at least a pair of PMOS and NMOS transistors in spaced adjacency. The mobility of electrons is faster than the mobility of holes in conventional bulk silicon substrates. Accordingly, in conventional CMOS transistors, the drive current of the PMOS transistor is less than the drive current of the NMOS transistor creating an imbalance. This imbalance is exacerbated in CMOS transistors fabricated on or within a tensilely stressed active device area formed in a strained lattice semiconductor substrate, e.g., strained Si—Ge on Si, because the increase in electron mobility is greater than the increase in hole mobility.

Channel carrier mobility of transistors based on strained Si substrates can be increased by applying a stress thereto. In forming P-channel transistors, channel carrier mobility is enhanced by applying a stressed dielectric layer exhibiting high compressive stress for increasing electron mobility. In N-channel transistors, channel carrier mobility is significantly increased by applying a stressed layer exhibiting high tensile stress for increasing hole mobility. Stressed dielectric layers, called stress liners, are applied to transistors wherein the source/drain regions are formed within the strained Si layer, and to transistors having relaxed source/drain regions formed on strained Si layers. The stress liner may comprise silicon carbide, silicon nitride or silicon oxynitride, and may be deposited by plasma enhanced chemical vapor deposition (PECVD) at a thickness of about 200 Å to about 1000 Å. Conventional PECVD conditions may be employed for deposition of a highly compressive layer or highly tensile dielectric layer. In depositing a stress liner exhibiting high compressive stress, both high frequency and low frequency power are applied. When depositing a stressed dielectric layer exhibiting high tensile stress, the low frequency power is significantly reduced.

Because the stress liners differ for P-channel and N-channel transistors, the stressed dielectric layers are typically patterned by reactive ion etching, which involves physically bombarding the surfaces to subtractively remove material. This etching process involves an "overetch" in order to clear the residue left behind. It is during this overetch process that the underlying NiSi layers are damaged, causing degradation of the NiSi. The degradation can be morphological, wherein mouse bites or missing NiSi is observed, as illustrated in FIG. 1 at 113a-113f, or electrical, wherein the resistivity is increased. Either or both types of degradation ultimately result in poor device parameters such as higher sheet resistance and external resistance.

A need therefore exists for methodology enabling fabrication of semiconductor devices comprising transistors with degradation resistant NiSi layers and for the resulting improved semiconductor devices having reduced resistance and improved performance.

SUMMARY

An aspect of the present disclosure is a semiconductor device comprising a transistor with reduced resistance.

Another aspect of the present disclosure is an efficient method of fabricating a semiconductor device comprising a transistor with reduced resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a transistor on a substrate, the transistor including source/drain regions and a gate electrode; forming a first layer of nickel containing a first amount of platinum over the transistor; forming a second layer of nickel containing a second amount of platinum on the first layer of nickel, the second amount of platinum being greater than the first amount of platinum; and annealing the first and second layers of nickel to form a layer of NiSi over the source/drain regions and the gate electrode, wherein the NiSi layer has a platinum composition gradient with platinum increasing in amount in a direction away from the source/drain regions and the gate electrode.

Aspects of the present disclosure include forming the first and second layers of nickel at a combined thickness of about 45 Å to about 100 Å with the first layer of nickel at a thickness of about 60% to about 80% of the combined thickness. Aspects also include annealing to form the layer of NiSi at a thickness of about 100 Å to about 220 Å. Further aspects include annealing by heating at a temperature of about 340° C. to about 450° C., such as at a temperature of about 360° C. to about 400° C. This technique can be used to effect annealing in a single step. Another aspect includes annealing by heating at a first stage at a first temperature of about 280° C. to about 350° C., for example about 300° C. to about 320° C., followed by heating at a second stage at a second temperature of about 360° C. to about 450° C., for example about 380° C. to about 420° C. Additional aspects include forming the first layer of nickel with a platinum content of about 8 weight % ("wt. %") to about 12 wt. %, for example about 10 wt. %, and the second layer of nickel with a platinum content of about 30 wt. % to about 70 wt. %, for example about 30 wt. % to about 50 wt. %. Aspects also include forming a capping layer of titanium nitride over the second layer before annealing, and removing the capping layer after annealing, followed by etching to remove unreacted nickel.

Another aspect of the present disclosure is a semiconductor device comprising: a silicon substrate; a transistor, comprising source/drain regions and a gate electrode, on the substrate; and a NiSi layer on the gate electrode and source/drain regions, the NiSi layer comprising platinum having a composition gradient, the platinum increasing in amount in a direction away from the source/drain regions and the gate electrode.

Aspects include devices with a P-channel transistor, an N-channel transistor, a first NiSi layer on the P-channel transistor, a second NiSi layer on the N-channel transistor, the first and second NiSi layers each comprising platinum having a concentration gradient with platinum increasing in amount toward the upper surface, i.e., increasing in amount in a direction away from the P-channel and N-channel transistors, a first stress liner on the P-channel transistor, and a second stress liner on the N-channel transistor. Further aspects include the NiSi layers having a thickness of about 100 Å to about 220 Å, for example about 100 Å to about 150 Å.

Another aspect of the present disclosure is a method of fabricating a semiconductor device, the method comprising: forming a P-channel and an N-channel transistor on a silicon substrate, each transistor including a polysilicon gate electrode and source/drain regions formed in the silicon substrate; depositing a first layer of nickel containing a first amount of platinum on both transistors; depositing a second layer of nickel having a second amount of platinum on the first layer of nickel, the second amount of platinum being greater than the first amount of platinum; depositing a titanium nitride capping layer on the second layer of nickel, annealing the first and second layers of nickel to form a single layer of NiSi containing platinum having a concentration gradient with the platinum increasing in amount in a direction away from the gate electrode and source/drain regions; etching to remove the capping layer and unreacted nickel; forming a first stress liner exhibiting high compressive stress over both transistors; selectively removing the first stress liner from the N-channel transistor; forming a second stress liner exhibiting high tensile stress over both transistors; and selectively removing the second stress liner from the P-channel transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
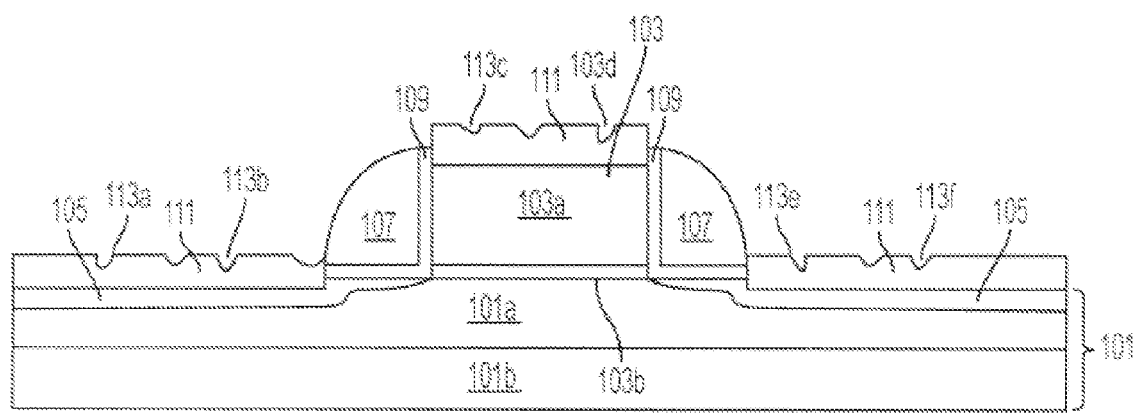
FIG. 1 schematically illustrates a conventional transistor device with a degraded NiSi layer.
Figure 2:
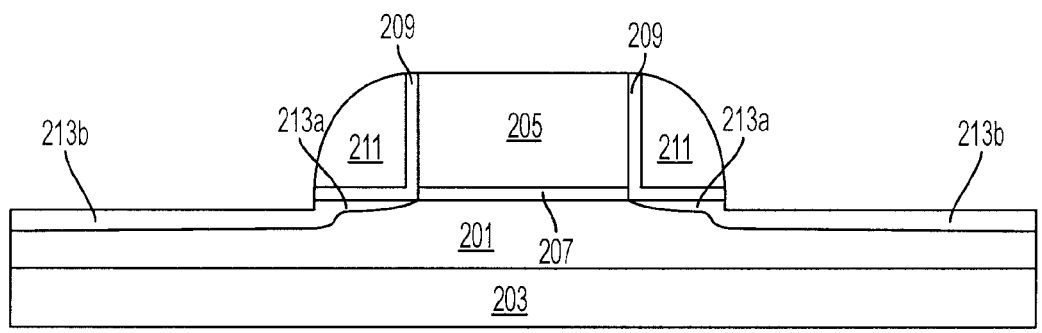
FIGS. 2 through 6 schematically illustrate sequential steps of a method in accordance with an embodiment of the present disclosure.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of NiSi layer degradation during subsequent processing, as during middle of the line processing to remove overlying stress liners, which NiSi layer degradation causes resistance problems and adversely affects transistor performance. In accordance with embodiments of the present disclosure, a transistor device is provided having a NiSi layer formulated to resist degradation, advantageously using methodology that does not impact process flow. In accordance with embodiments of the present disclosure, NiSi layer damage is prevented or significantly reduced by formulating the NiSi layer with a platinum composition gradient with the amount of platinum increasing in a direction toward its upper surface, i.e., in a direction away from the source/drain regions and the gate electrode, thereby shielding the NiSi layer from physical damage during post NiSi processing as when removing an overlying stress liner by etching.

Embodiments of the present disclosure include forming two layers of nickel on a silicon substrate and a silicon gate electrode, the first layer having a relatively low concentration of platinum and the second having a relatively high concentration of platinum, and annealing the two layers to form a single layer of NiSi. During annealing, platinum diffuses to form a composition gradient with the amount of platinum increasing in a direction away from the substrate and gate electrode. It was found that such a concentration gradient of platinum effectively shields the NiSi layer from physical damage during subsequent processing, e.g., etching, while concomitantly maintaining the integrity of the NiSi layer.

Methodology in accordance with embodiments of the present disclosure includes forming forming a transistor on a substrate, the transistor including source/drain regions and a gate electrode, depositing a first layer of nickel containing a relatively low amount of platinum, for example about 8 wt. % to about 12 wt. %, e.g., about 10 wt. %, over the transistor, forming a second layer of nickel containing a relatively high amount of platinum, such as about 30 wt. % to about 70 wt. %, e.g., about 30 wt. % to about 50 wt. %, on the first layer. The first and second layers of nickel are formed at a combined thickness of about 45 Å to about 100 Å, with the first layer of nickel at a thickness of about 60% to about 80% of the combined thickness. A capping layer of silicon nitride is formed over the second nickel layer. An RTA process is then implemented to convert the platinum containing nickel layers into a single layer of NiSi over the source/drain regions and the gate electrode, such that the NiSi layer has a platinum composition gradient with the amount of platinum increasing in a direction away from the source/drain regions and the gate electrode. The resulting platinum concentration gradient protects the NiSi film without increasing the resistivity of the layer.

The annealing process may be controlled to form a layer of NiSi at a thickness of about 100 Å to about 220 Å. Annealing may comprise a single heating stage at a temperature of about 340° C. to about 450° C., such as at a temperature of about 360° C. to about 400° C. Alternatively, a two stage annealing process can be performed, as by heating at a first temperature of about 280° C. to about 350° C., such as about 300° C. to about 320° C., followed by heating at a second temperature of about 360° C. to about 450° C., such as about 380° C. to about 420° C. In accordance with embodiments of the present disclosure, the capping layer is removed after annealing followed by etching to remove unreacted nickel, employing conventional methodology.

Embodiments of the present disclosure include forming two transistors, one P-channel and one N-channel transistor. A first stress liner exhibiting high compressive stress can be formed over both transistors, and the first stress liner is selectively removed, as by etching, from the N-channel transistor. A second stress liner exhibiting high tensile stress can be subsequently formed over both transistors, and the second stress liner is selectively removed, as by etching, from the P-channel transistor. During etching of the stress liners, the thus formed platinum concentration gradient prevents the NiSi from being etched and damaged.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A method in accordance with an embodiment of the present disclosure is schematically illustrated in FIGS. 2 through 5, wherein like reference characters denote like features. Adverting to FIG. 2, strained Ge—Si layer 201 is formed over Si layer 203. Ge—Si layer 201 may be globally strained or locally strained under the source/drain regions. Gate electrode 205 is formed over strained Ge—Si layer 201 with a gate dielectric 207 therebetween. Lightly doped source/drain regions 213a are formed in Ge—Si layer 201 using the gate electrode 205 as a mask in a conventional manner. A sidewall spacer comprising a silicon oxide liner 209, as at a thickness of about 60 Å to about 600 Å, is formed on side surfaces of the gate electrode 205 and on a portion of the upper surface of strained Ge—Si layer 201. Silicon nitride spacers 211 are then formed on the silicon oxide liner 209 as by employing PECVD followed by etching.

It should be appreciated that liner 209 may be deposited by ALD and may also comprise silicon nitride. Silicon oxide liner 209 advantageously prevents consumption of the gate electrode 205 by silicidation on the side surfaces thereof, and advantageously prevents a subsequently formed thin layer of NiSi on the silicon nitride sidewall spacers 211 from contacting a NiSi contact layer on the upper surface of the gate electrode 205 and/or from contacting NiSi contact layers on the upper surface of the strained Si layer 201, thereby preventing NiSi bridging along the silicon nitride sidewall spacers.

Subsequently, heavily doped source/drain regions 213b are formed in Ge—Si layer 201 using gate electrode 205 and sidewall spacers 209 and 211 as a mask, employing conventional implantation techniques, as by ion implanting boron, phosphorus, or arsenic.

Figure 3:
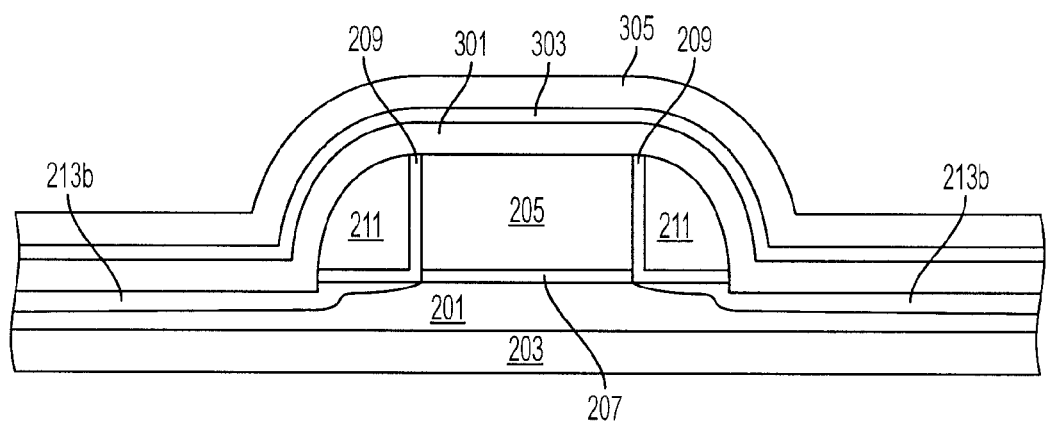

Adverting to FIG. 3, a first layer of nickel 301 is deposited over the source/drain regions 213b, the spacers 211, the oxide liner 209, and the gate electrode 205. First layer of nickel 301 may be formed, for example, with a platinum content of about 8 wt. % to about 12 wt. %, such as about 10 wt. %. The first layer of nickel can be formed by sputtering using a target comprising Ni and 10 wt. % Pt. Over the first layer of nickel 301, a second layer of nickel 303 is deposited. The second layer of nickel 303 may be formed, for example, with a platinum content of about 30 wt. % to about 70 wt. %, such as about 30 wt. % to about 50 wt. %. The second layer of nickel can be sputtered using a target of Ni containing an amount of Pt within the range of 30 to 100%. The first nickel layer 301 and second nickel layer 303 may be formed to a combined thickness of about 45 Å to about 100 Å using a conventional deposition tool, for example on an AMAT Endura sputtering system, at a power of 1500 W to 2500 W, e.g., 2000 W, and using an Argon flow of 20 sccm to 40 sccm, e.g., 2000 sccm, or an Argon and Hydrogen mixture with a flow of 3 sccm to 10 sccm, e.g., 5 sccm. The first layer of nickel 301 may be formed at a thickness of about 60% to about 80% of the combined thickness, such as about 70% of the combined thickness.

A capping layer 305 may be formed over the second nickel layer 303 to prevent oxidation of the underlying metal. Capping layer 305 may be titanium nitride.

Figure 4:
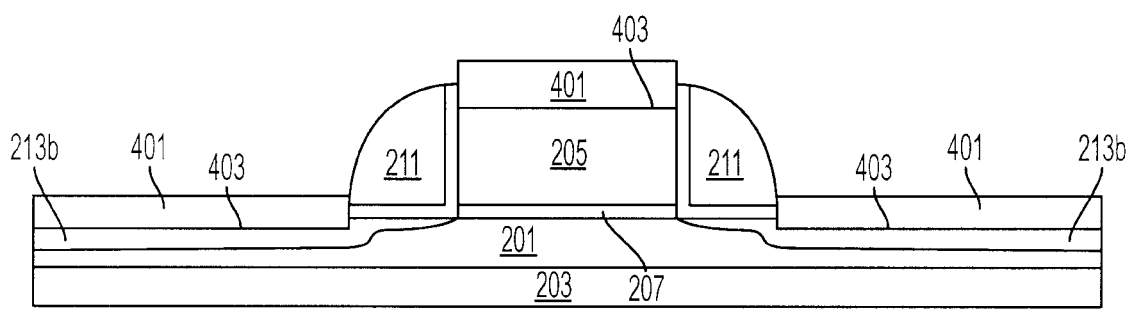

RTA and etch processes are performed to form a NiSi layer 401 over the source/drain regions 213b and the gate electrode 205, as illustrated in FIG. 4. The resulting NiSi layer 401 has a composition gradient of platinum from about 8 wt. % to about 12 wt. %, such as about 10 wt. %, at the silicon interface 403 to about 30 wt. % to about 70 wt. %, such as about 30 wt. % to about 50 wt. %, at the opposite surface. NiSi layer 401 may be formed at a thickness of about 100 Å to about 220 Å, such as at a thickness of about 100 Å to about 150 Å.

Nickel silicide is commonly doped with platinum to improve the material and electrical properties. Platinum has proven to be effective in preventing the nickel disilicide formation ($NiSi_2$). It was found that strategic platinum doping can also be used to effectively shield a NiSi layer from physical damage during MOL processing (post NiSi processing) while concomitantly maintaining the NiSi integrity. However, platinum also increases the resistivity of NiSi. In accordance with embodiments of the present disclosure, effective shielding of a NiSi layer is achieved while avoiding a problematic increase in resistivity by compositionally grading a platinum doped NiSi layer.

The RTA process may be a one-step or two-step process (with a clean in between the two steps) in an inert or reducing atmosphere, e.g., a nitrogen ($N_2$)—containing atmosphere. The single step anneal may be implemented at a temperature of about 340° C. to about 450° C., for example at a temperature of about 360° C. to about 400° C., for about 5 to 35 seconds. During the single step anneal the nickel layers are converted directly to a low resistivity monosilicide (NiSi).

The two-step anneal may be conducted by first heating at a temperature of about 280° C. to about 350° C., for example about 300° C. to about 320° C., e.g., 300° C., during which metal rich silicide, $Ni_2Si$, is formed. During the second step, the temperature may be raised to about 360° C. to about 450° C., such as about 380° C. to about 420° C., e.g., 420° C. During the second annealing step, the metal rich silicide is converted to monosilicide. The total time for the two step annealing can be the same as for the single step anneal process, for example 5 seconds for the first step and 30 seconds for the second step. The two-step anneal therefore reduces the time at which annealing occurs at a high temperature, thereby reducing the rough interfaces between the NiSi and the underlying Si layer.

After NiSi layer 401 is formed, the capping layer 305 and unreacted Ni on the wafer are then easily removed, as by wet chemical stripping. In an embodiment of the present disclosure, the capping layer and unreacted Ni are removed by an anisotropic sputter etching or by immersing the wafer into a solution of $H_2SO_4$, $H_2O_2$, and water (SPM) or a solution of $NH_4OH$, $H_2O_2$ and water (APM).

Figure 5:
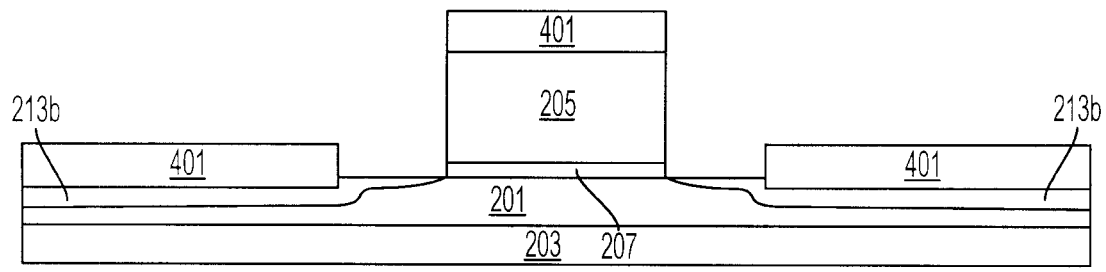
Figure 6:
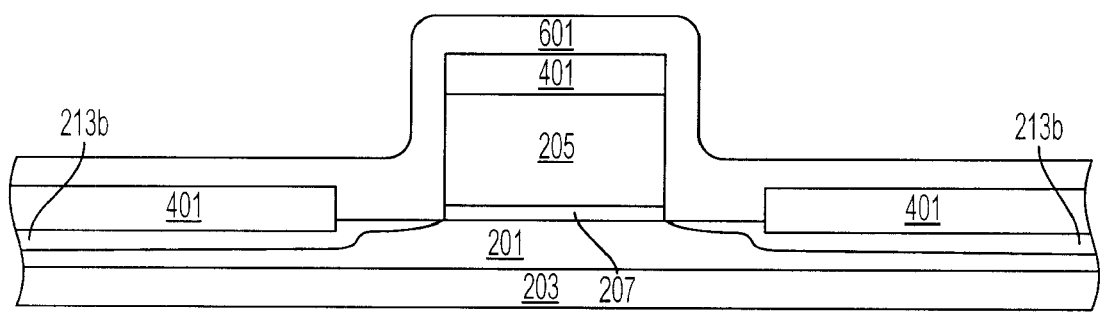
Figure 7:
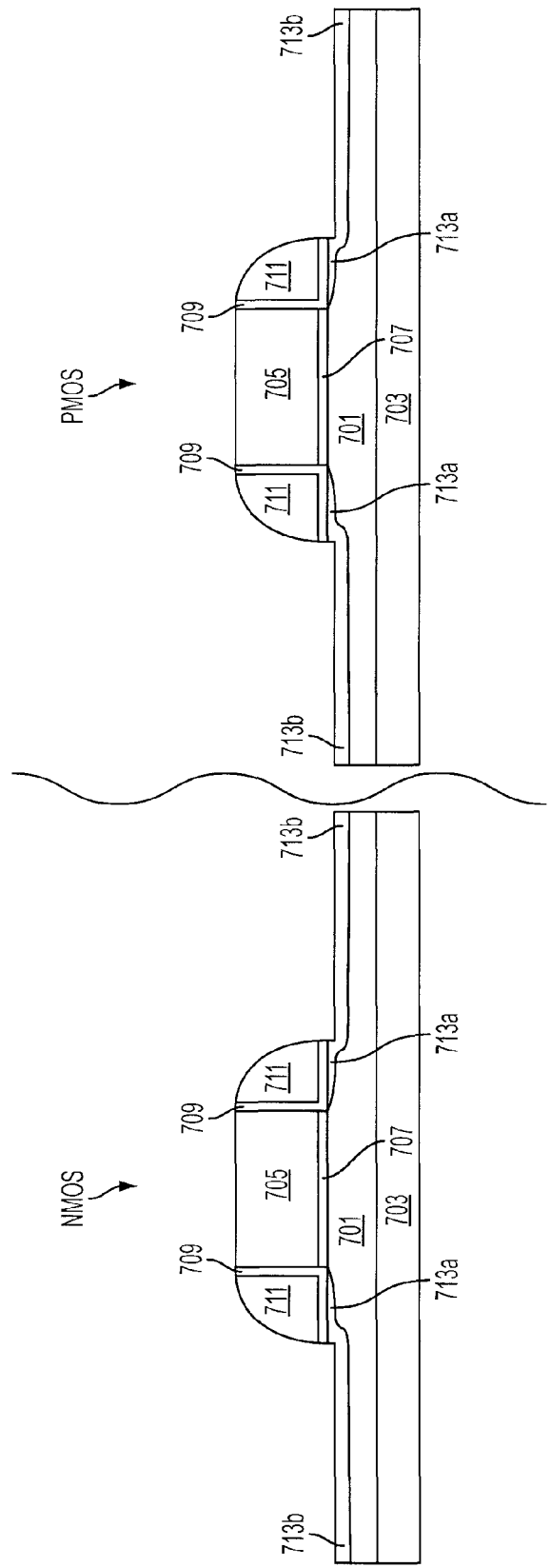
FIGS. 7 through 15 schematically illustrate sequential steps of a method in accordance with another embodiment of the present disclosure.

As illustrated in FIG. 5, the liner 209 and sidewall spacers 211 are then removed, exposing a portion of the upper surface of strained Si layer 201 between the silicide layers 401 and the side surfaces of gate electrode 205, with a very thin oxide layer (not shown) thereon, e.g., less than 50 Å, serving as a buffer layer. A highly stressed dielectric layer 601, such as a silicon nitride layer exhibiting high compressive stress, is then deposited by PECVD, as shown in FIG. 6. The highly stressed dielectric layer 601 serves to increase channel electron mobility, thereby increasing the drive current.

Another embodiment of the present disclosure is schematically illustrated in FIGS. 7 through 15. Adverting to FIG. 7, a CMOS device is schematically illustrated comprising an NMOS transistor portion at the left and a PMOS transistor portion on the right, wherein similar features are denoted by similar reference characters. Strained Si layer 701 is formed over Si—Ge layer 703. As in previous discussed embodiments, Si layer 701 may be globally strained or locally strained in the source/drain regions. Gate electrodes 705 are formed over strained Si layer 701 with gate dielectric 707 therebetween. Lightly doped source/drain regions 713a are formed in Si layer 701 using gate electrodes 705 as a mask in a conventional manner. Sidewall spacers comprising oxide liner 709, as at a thickness of about 60 Å to about 600 Å, are formed on side surfaces of gate electrodes 705 and on portions of the upper surface of strained Si layer 701. Silicon oxide liner 709 can be formed in the same manner as discussed with respect to silicon oxide liner 209 in FIG. 2. Silicon nitride spacers 711 are then formed on silicon oxide liners 709 as by employing PECVD followed by etching.

Subsequently, heavily doped source/drain regions 713b are formed in Si layer 701 using gate electrodes 705 and sidewall spacers 709 and 711 as a mask, employing conventional implantation techniques, as by ion implanting boron, phosphorus, or arsenic.

Figure 8:
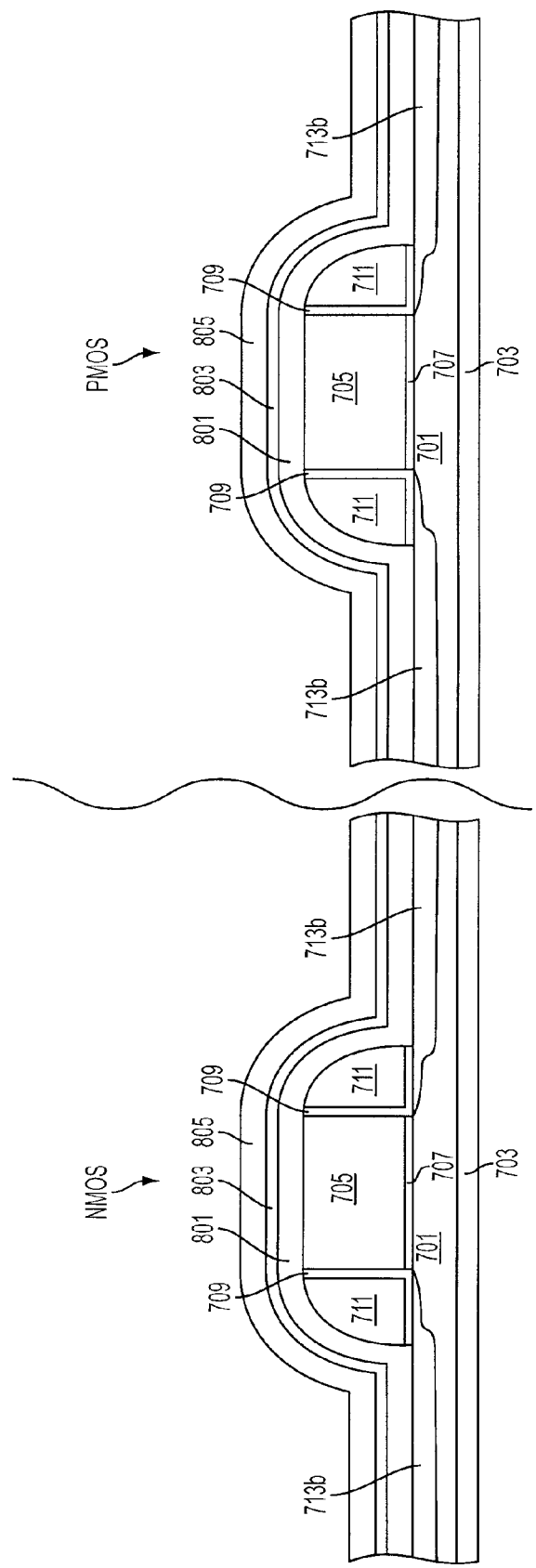

As illustrated in FIG. 8, a first layer of nickel 801 is deposited over the source/drain regions 713b, spacers 711, oxide liners 709, and gate electrodes 705. First layer of nickel 801 may be formed, for example, with a platinum content of about 8 wt. % to about 12 wt. %, such as about 10 wt. %. Over the first layer of nickel 801, a second layer of nickel 803 is deposited. Second layer of nickel 803 may be formed, for example, with a platinum content of about 30 wt. % to about 70 wt. %, such as about 30 wt. % to about 50 wt. %. The first nickel layer 801 and second nickel layer 803 may be formed in a conventional deposition environment, for example on an AMAT Endura sputtering system, to a combined thickness of about 45 Å to about 100 Å. The first layer of nickel 801 may be formed at a thickness of about 60% to about 80% of the combined thickness, such as about 70% of the combined thickness.

A capping layer 805 is formed over the second nickel layer 803 to prevent oxidation of the underlying metal. Capping layer 805 may be titanium nitride.

Figure 9:
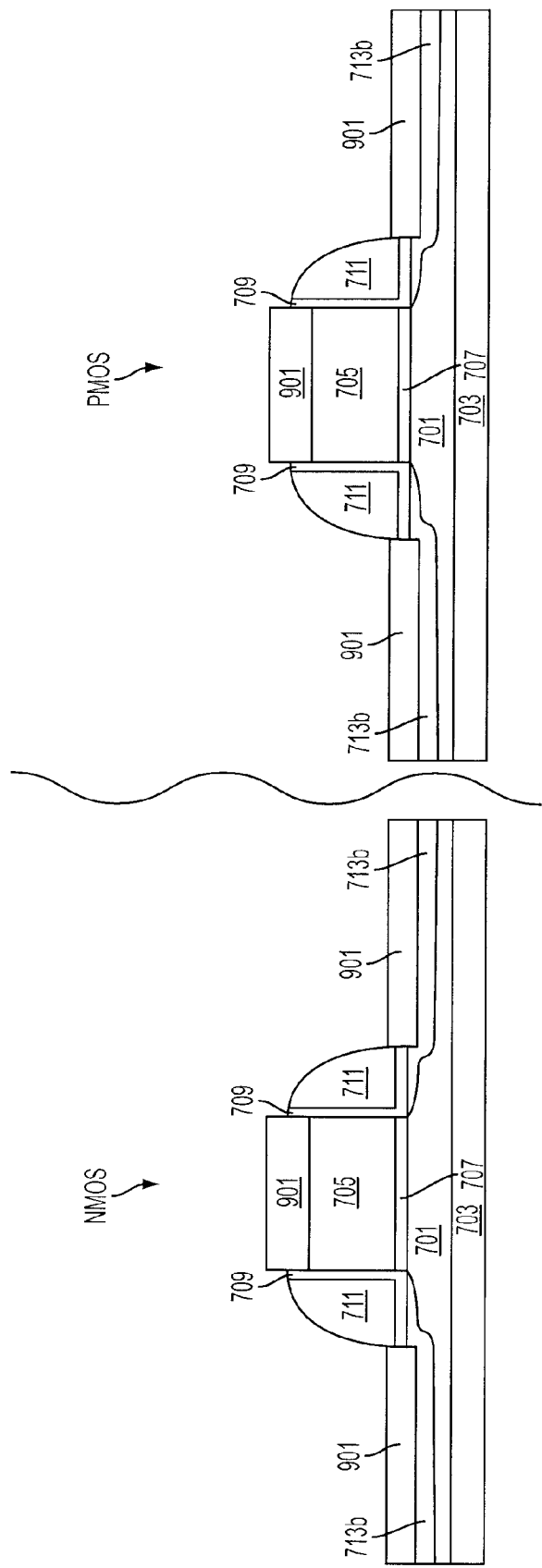

RTA and etch processes are performed to form NiSi layers 901 over source/drain regions 713b and gate electrodes 705, as illustrated in FIG. 9. The resulting NiSi layers 901 have a composition gradient of platinum from about 8 wt. % to about 12 wt. %, such as about 10 wt. %, at the bottom surface that contacts the silicon gate electrodes 705 and source/drain regions 713b, to about 30 wt. % to about 70 wt. %, such as about 30 wt. % to about 50 wt. %, at the opposite surface. NiSi layers 901 may be formed at a thickness of about 100 Å to about 220 Å, such as at a thickness of about 100 Å to about 150 Å. The RTA process may be a one-step or two-step process, as described above with respect to FIG. 4.

After NiSi layers 901 are formed, the capping layer 805 and unreacted Ni on the wafer are then easily removed, as by wet chemical stripping. In an embodiment of the present disclosure, the capping layer and unreacted Ni are removed by an anisotropic sputter etching or by immersing the wafer into a solution of $H_2SO_4$, $H_2O_2$, and water (SPM) or a solution of $NH_4OH$, $H_2O_2$ and water (APM).

Figure 10:
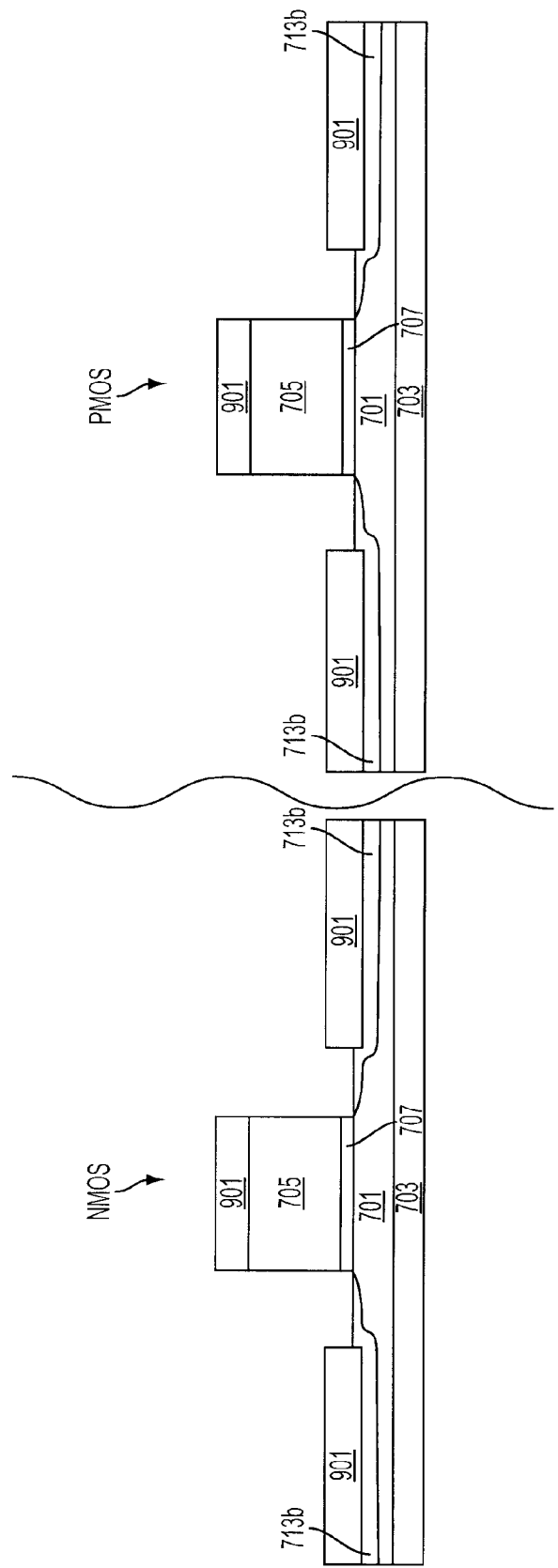

As illustrated in FIG. 10, liners 709 and sidewall spacers 711 are then removed exposing portions of the upper surface of strained Si layer 701 between the silicide layers 901 and the side surfaces of gate electrodes 705, with a very thin oxide layer (not shown) thereon, e.g., less than 50 Å, serving as a buffer layer.

Figure 11:
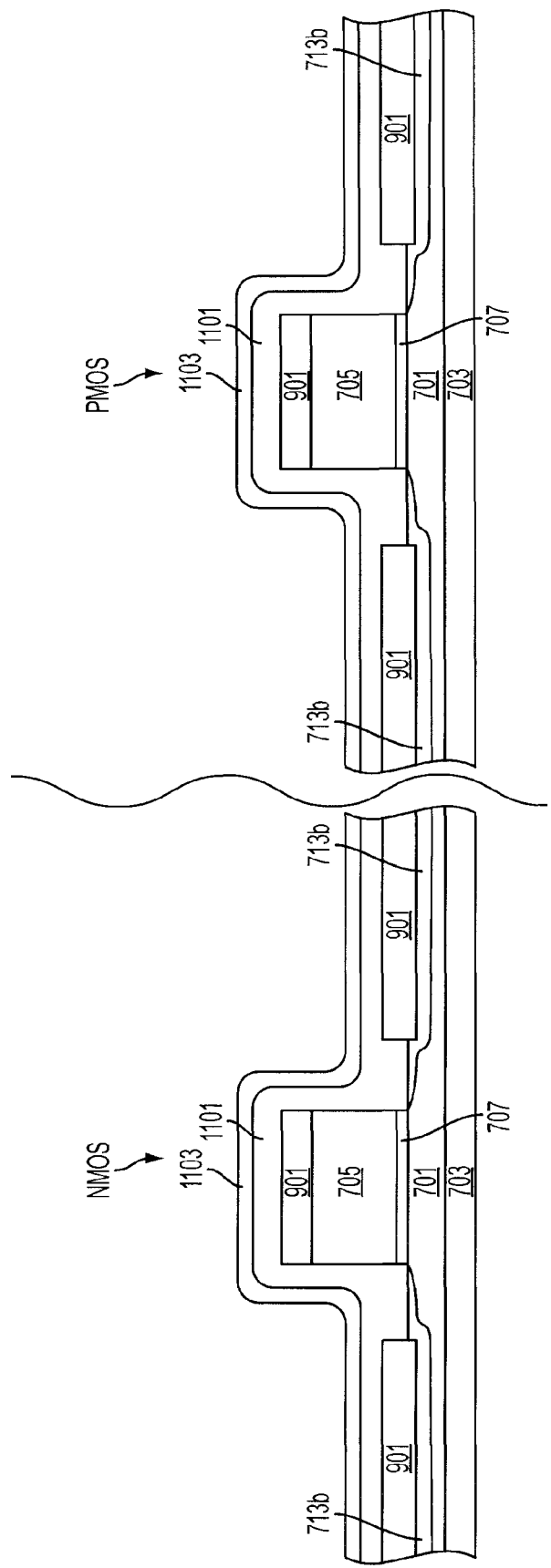

A highly compressive stressed silicon nitride film 1101, e.g., having a compressive stress greater than 1.5 GPa, is then deposited over both the NMOS and PMOS transistors as shown in FIG. 11. Deposition of highly compressive stressed silicon nitride film 1101 may be implemented in a conventional manner. Multiple layer deposition and plasma treatment further increases compressive stress. Subsequently, a thin oxide or oxynitride film 1103 is deposited, as illustrated in FIG. 11, by a conventional CVD process. Typically oxide or oxynitride film 1103 is deposited at a thickness of about 30 Å to about 60 Å.

Figure 12:
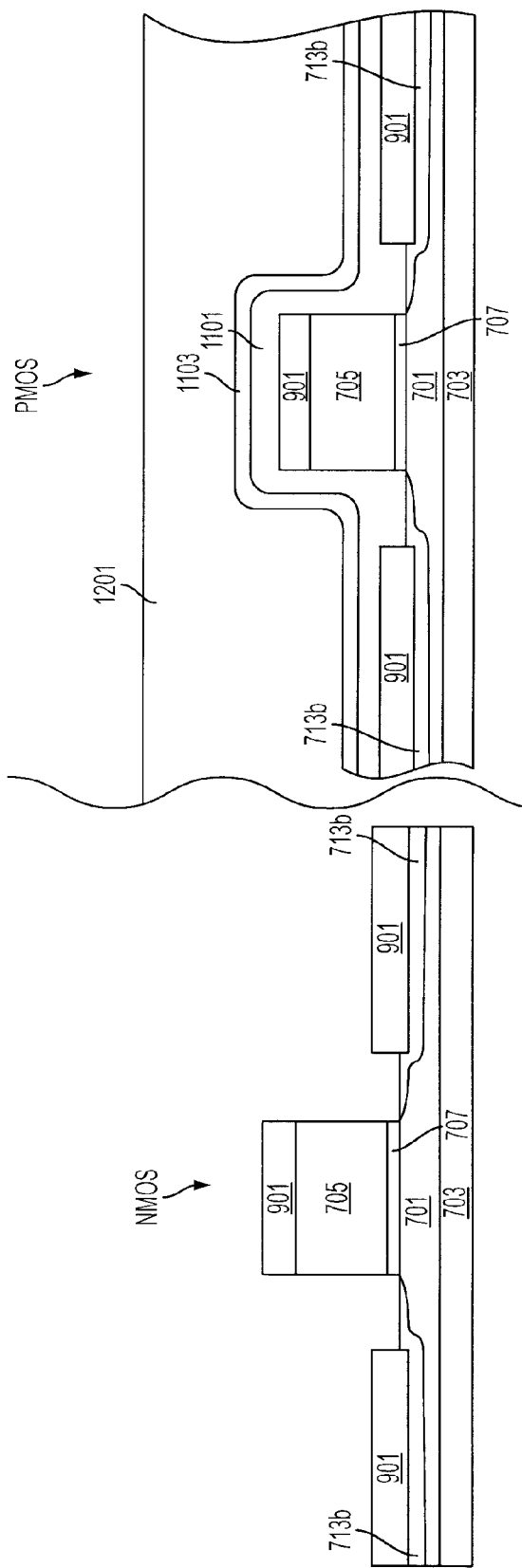

Subsequently, a mask 1201, e.g., photoresist or hard mask is applied over the PMOS transistor, as illustrated in FIG. 12, and the oxide or oxynitride film 1103 and high compressive stress silicon nitride film 1101 are removed from the NMOS transistor.

Figure 13:
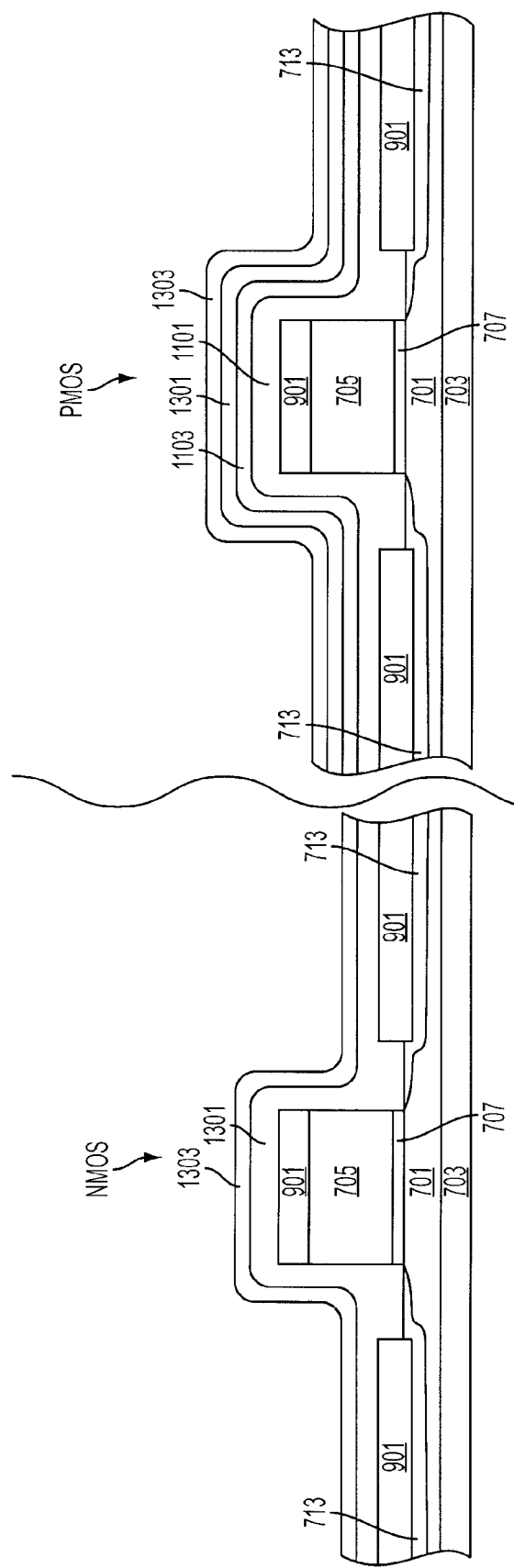

Adverting to FIG. 13, the mask 1201 is removed from the PMOS transistor. A highly tensile stressed silicon nitride film 1301, having a tensile stress of greater than 1.5 GPa, is then deposited over both the PMOS and NMOS transistors. Deposition of highly tensile stressed film 1301 can be implemented in a conventional manner. A thin oxide or oxynitride film 1303 is then deposited by a conventional CVD process, as at a thickness of about 30 Å to about 60 Å.

Figure 14:
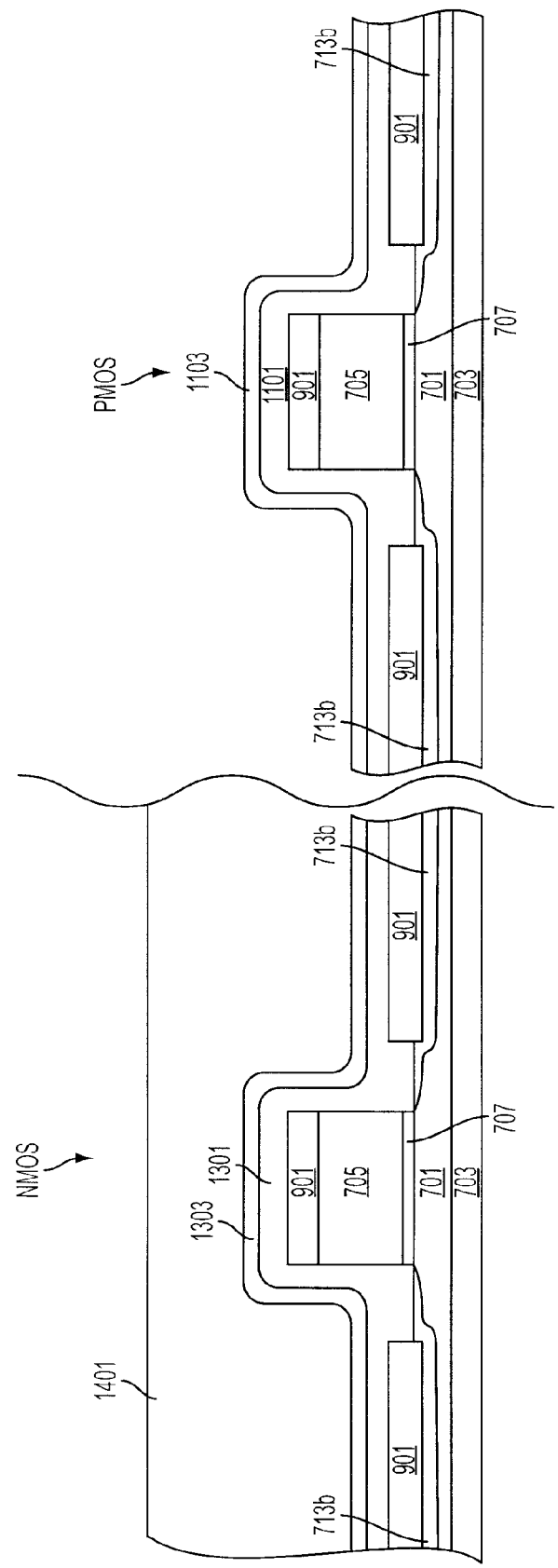
Figure 15:
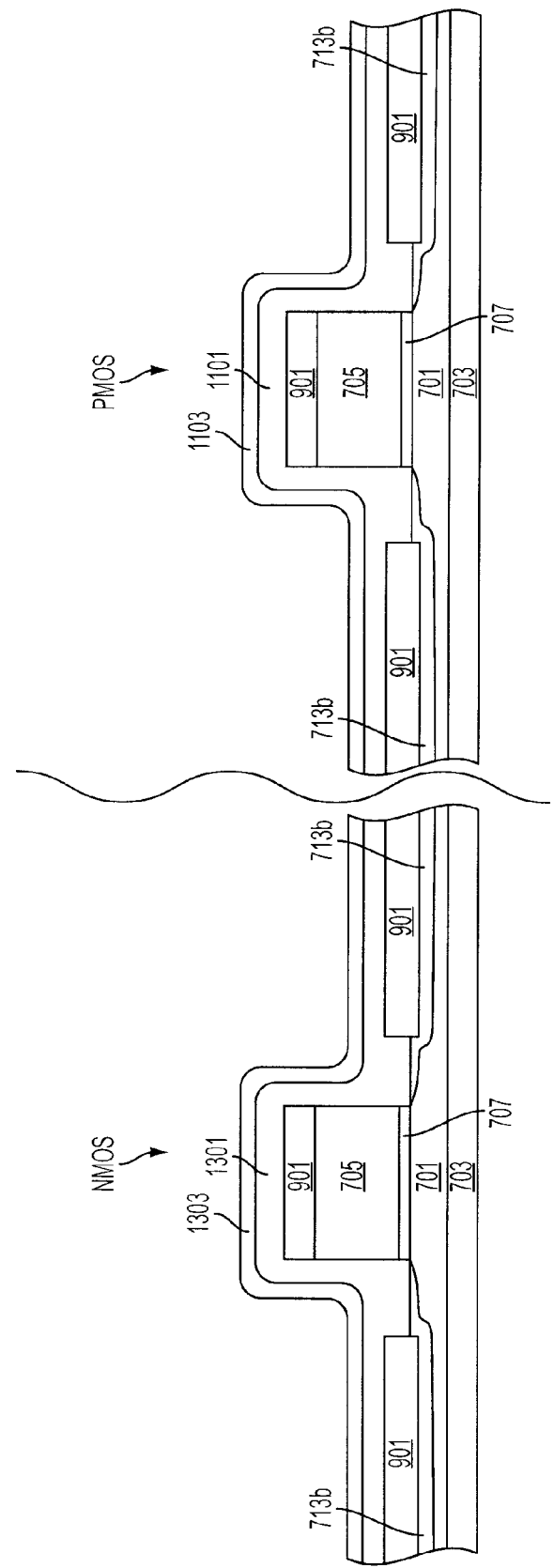

Adverting to FIG. 14, a mask 1401, such as a photoresist or hard mask, is then applied over the NMOS transistor, and the oxide or oxynitride film 1303 and the highly tensile stressed silicon nitride film 1301 are selectively removed from the PMOS transistor stopping on the oxide or oxynitride film 1103. The mask 1401 is then removed, and the resulting structure is illustrated in FIG. 15 which comprises an oxide or oxynitride film 1303 and a highly tensile stressed silicon nitride film 1301 over the NMOS transistor and an oxide or oxynitride film 1103 and a highly compressive stressed silicon nitride film 1101 over the PMOS transistor. The resulting CMOS device comprises both PMOS and NMOS transistors with increased channel carrier mobility and, hence, increased drive current, without increasing the resistivity of the transistors.

The embodiments of the present disclosure can achieve several technical effects, including resistance reduction, improved transistor and circuit performance, and reduced power requirements. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a transistor on a substrate, the transistor comprising source/drain regions and a gate electrode;
    forming a first layer of nickel, containing a first amount of platinum, over the transistor;
    forming a second layer of nickel, containing a second amount of platinum, on the first layer of nickel, wherein the second amount of platinum is greater than the first amount of platinum; and
    annealing the first and second layers of nickel to form a layer of nickel silicide over the source/drain regions and the gate electrode, wherein the nickel silicide layer has a platinum composition gradient with platinum increasing in amount in a direction away from the source/drain regions and the gate electrode.

2. The method according to claim 1, comprising forming the first and second layers of nickel at a combined thickness from about 45 Å to about 100 Å.

3. The method according to claim 2, comprising forming the first layer of nickel at a thickness of about 60% to about 80% of the combined thickness.

4. The method according to claim 3, comprising annealing to form the layer of nickel silicide at a thickness of about 100 Å to about 220 Å.

5. The method according to claim 1, comprising annealing by heating at a temperature of about 340° C. to about 450° C.

6. The method according to claim 5, comprising annealing by heating at a temperature of about 360° C. to about 400° C.

7. The method according to claim 1, comprising annealing by:
    (a) heating at a first temperature of about 280° C. to about 350° C.;
    (b) followed by heating at a second temperature of about 360° C. to about 450° C.

8. The method according to claim 7, comprising heating at the first temperature of about 300° C. to about 320° C. and heating at the second temperature of about 380° C. to about 420° C.

9. The method according to claim 1, comprising forming the first layer of nickel with a platinum content of about 8 wt. % to about 12 wt. %.

10. The method according to claim 9, comprising forming the second layer of nickel with a platinum content of about 30 wt. % to about 70 wt. %.

11. The method according to claim 10, comprising:
    forming the first layer of nickel at a platinum content of about 10 wt. %; and
    forming the second layer of nickel at a platinum content of about 30 wt. % to about 50 wt. %.

12. The method according to claim 1, further comprising forming a capping layer of titanium nitride over the second layer of nickel before annealing.

13. The method according to claim 12, further comprising:
    removing the capping layer after annealing; and
    etching to remove unreacted nickel.

14. A method comprising:
    forming a P-channel and an N-channel transistor on a silicon substrate, each transistor including a polysilicon gate electrode and source/drain regions formed in the silicon substrate;
    depositing a first layer of nickel containing a first amount of platinum on both transistors;
    depositing a second layer of nickel having a second amount of platinum on the first layer of nickel, wherein the second amount of platinum is greater than the first amount of platinum;
    depositing a titanium nitride capping layer on the second layer of nickel;
    annealing the first and second layers of nickel to form a layer of nickel silicide containing platinum having a concentration gradient with platinum increasing in amount in a direction away from the gate electrode and source/drain regions,
    etching to remove the capping layer and unreacted nickel;
    forming a first stress liner exhibiting high compressive stress over both transistors;
    selectively removing the first stress liner from the N-channel transistor;
    forming a second stress liner exhibiting high tensile stress over both transistors; and
    selectively removing the second stress liner from the P-channel transistor.

* * * * *